United States Patent [19]
Lee

[11] Patent Number: 6,105,215
[45] Date of Patent: Aug. 22, 2000

[54] CLIP HEAT ASSEMBLY FOR HEAT SINK

[75] Inventor: Chao-Yang Lee, Taipei, Taiwan

[73] Assignee: Foxconn Precision Components Co., Ltd., Taipei Hsien, Taiwan

[21] Appl. No.: 09/377,889

[22] Filed: Aug. 19, 1999

[30] Foreign Application Priority Data

Jun. 11, 1999 [TW] Taiwan ................................. 88209569

[51] Int. Cl.⁷ .......................................................... H05K 7/20
[52] U.S. Cl. .......................... 24/458; 361/719; 361/704; 165/80.3; 257/718; 174/16.3
[58] Field of Search ............................. 24/458, 459, 457, 24/473, 464, 472, 517, 572, 563, 546, 545; 174/16.3; 361/704, 707, 709, 807, 719, 720; 257/718, 719; 165/80.3

[56] References Cited

U.S. PATENT DOCUMENTS

| | | | |
|---|---|---|---|
| 4,712,159 | 12/1987 | Clemens | 361/704 |
| 5,662,163 | 9/1997 | Mira | 165/80.3 |
| 5,730,210 | 3/1998 | Kou | 165/80.3 |
| 5,761,041 | 6/1998 | Hassanzadeh et al. | 361/704 |
| 5,870,286 | 2/1999 | Butterbaugh et al. | 361/704 |
| 5,883,782 | 3/1999 | Thurston et al. | 364/704 |
| 5,947,191 | 9/1999 | Hiteshew et al. | 165/80.3 |
| 5,969,947 | 10/1999 | Johnson et al. | 361/704 |

*Primary Examiner*—Anthony Knight
*Assistant Examiner*—Robert J. Sandy
*Attorney, Agent, or Firm*—Wei Te Chung

[57] ABSTRACT

A clip assembly comprises a body and a pair of separate fasteners. The body comprises a base for engaging with a heat sink, a pair of arms extending from opposite diagonal corners of the base, and a pair of end portions formed on free ends of the arms. An elliptical clearance hole is defined in each end portion for allowing movement of the fastener therein during engagement with a corresponding engaging hole of a printed circuit board. A pair of arcuate surfaces is formed proximate opposite transverse sides of each clearance hole. Each fastener comprises an intermediate main portion, and a head and an engaging portion formed on opposite ends of the main portion. The head has a transition section for engaging with the arcuate surfaces of the body to ensure vertical linear movement of the fastener during engagement with the corresponding engaging hole.

13 Claims, 7 Drawing Sheets

CLIP HEAT ASSEMBLY FOR HEAT SINK

BACKGROUND OF THE INVENTION

1. Field of The Invention

The present invention relates to a clip assembly for attaching a heat sink to a chip mounted on a printed circuit board, and particularly to a clip assembly for facilitating assembly of a heat sink to a chip.

2. Description of Prior Art

As chips such as microprocessors contain more circuitry and operate at faster speeds, greater amounts of heat are generated, which must be dissipated for reliable operation. A heat sink made from heat conductive material such as aluminum is commonly used to dissipate heat generated by a chip. The heat sink is retained in direct contact with the chip to dissipate the heat into the surrounding environment.

A heat sink is usually attached to a chip by a clip. A conventional clip 1 made from plastic is shown in FIG. 1. The clip 1 comprises a base 2, a pair of symmetrical arms 3 outwardly extending from the base 2 at an incline, and a pair of engaging posts 4 integrally extending from free ends of the arms 3. The base 2 abuts against a top surface of a heat sink 7 positioned over a chip 9 and retains the clip 1 on the heat sink 7. Each engaging post 4 has an expanded free end 5 for resiliently engaging with a corresponding engaging hole 80 defined in a printed circuit board (PCB) 8. A slot 6 is defined in the expanded free end 5 for providing additional resiliency. When the base 2 of the clip 1 is engaged with the heat sink 7, the arms 3 are pressed to engage the engaging posts 4 with the engaging holes 80 of the PCB 8. Since the engaging posts 4 are integral with the arms 3, proper alignment between the engaging posts 4 and the corresponding engaging holes 80 is difficult to insure. During engagement between each engaging post 4 and the corresponding engaging hole 80, the free end 5 of the engaging post 4 may be damaged due to an excessive interferential stress therebetween.

To solve the above-mentioned problem, resilient material, such as ABS, Nylon and Nylon 66, which are well-known in the art, is added to provide the clip 1 with additional resiliency. However, the retention force of the clip 1 is then insufficient to firmly retain the heat sink 7 on the chip 9 thereby adversely affecting the performance of the heat sink 7, especially when a fan (not shown) is attached to the heat sink 7 for enhancing cooling properties.

The present invention is directed at solving the aforesaid problems by providing a clip assembly consisting of a body and a pair of separate fasteners.

SUMMARY OF THE INVENTION

Accordingly, one object of the present invention is to provide a clip assembly for facilitating assembly of a heat sink to a chip while obviating damage thereof.

Another object of the present invention is to provide a clip assembly for securely retaining a heat sink on a chip.

In order to achieve the objects set forth, a clip assembly in accordance with the present invention comprises a body and a pair of separate fasteners. The body comprises a base for engaging with a heat sink, a pair of arms extending from opposite diagonal corners of the base, and a pair of end portions formed on free ends of the arms. An elliptical clearance hole is defined in each end portion for allowing movement of the fastener therein during engagement with a corresponding engaging hole of a printed circuit board. A pair of arcuate surfaces is formed proximate opposite transverse sides of each clearance hole.

Each fastener comprises an intermediate main portion, and a head and an engaging portion formed on opposite ends of the main portion. A transition section is formed on a bottom portion of the head tapering toward the main portion. The transition section engages with the arcuate surfaces of the body to ensure vertical linear movement of the fastener during engagement with the corresponding engaging hole.

Other objects, advantages and novel features of the invention will become more apparent from the following detailed description when taken in conjunction with the accompanying drawings.

DETAILED DESCRIPTION OF THE EMBODIMENTS

Figure 1:
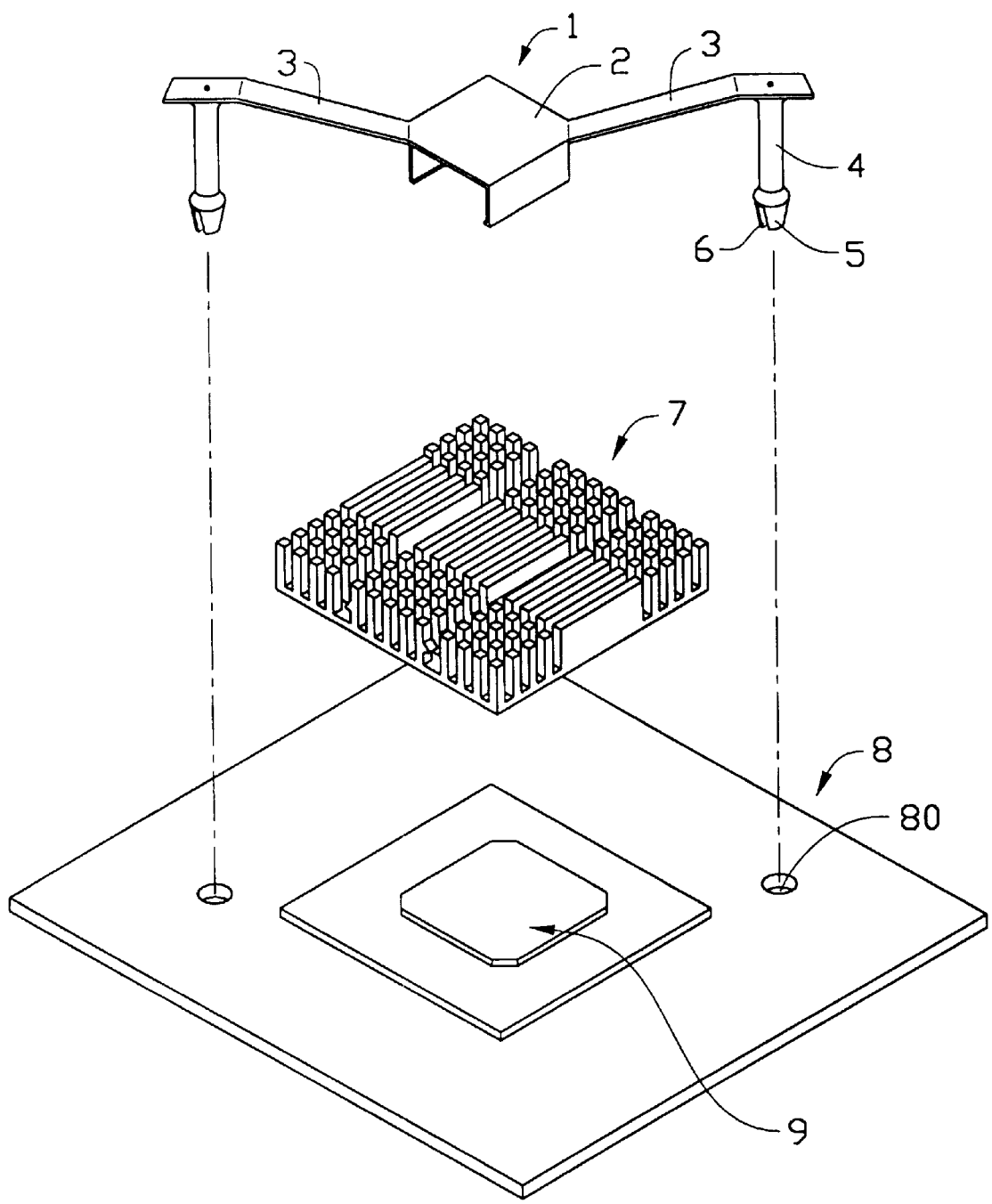
FIG. 1 is an exploded view of a conventional clip assembly, a heat sink and a chip mounted on a printed circuit board.

Reference will now be made to the drawing figures to describe the present invention in detail. It is noted here that for facilitating understanding like components are designated by like reference numerals throughout the various embodiments of the present invention as shown in the attached drawing figures.

Figure 2:
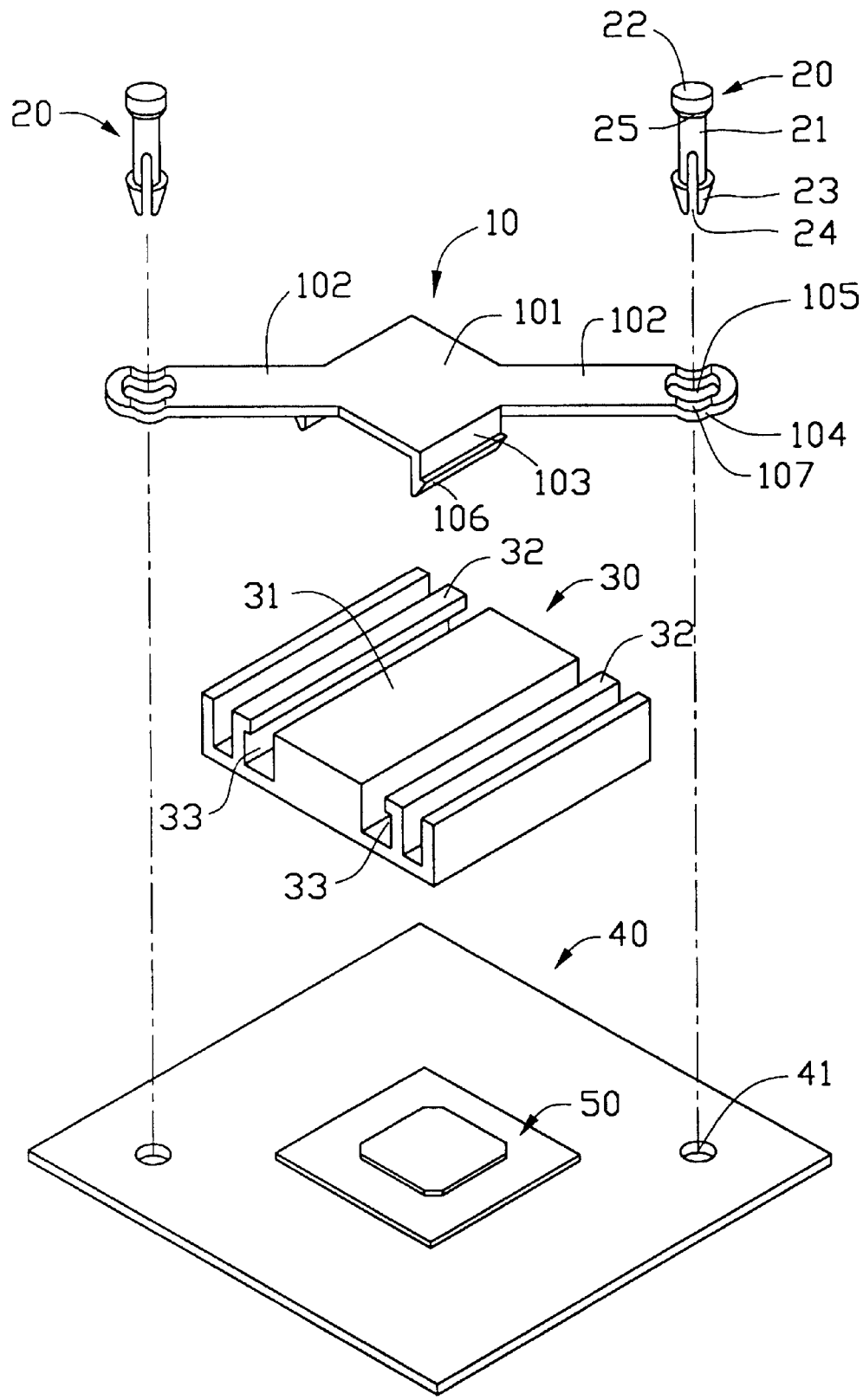
FIG. 2 is an exploded view of a clip assembly in accordance with a first embodiment of the present invention, a first heat sink and a chip mounted on a printed circuit board.
Figure 3:
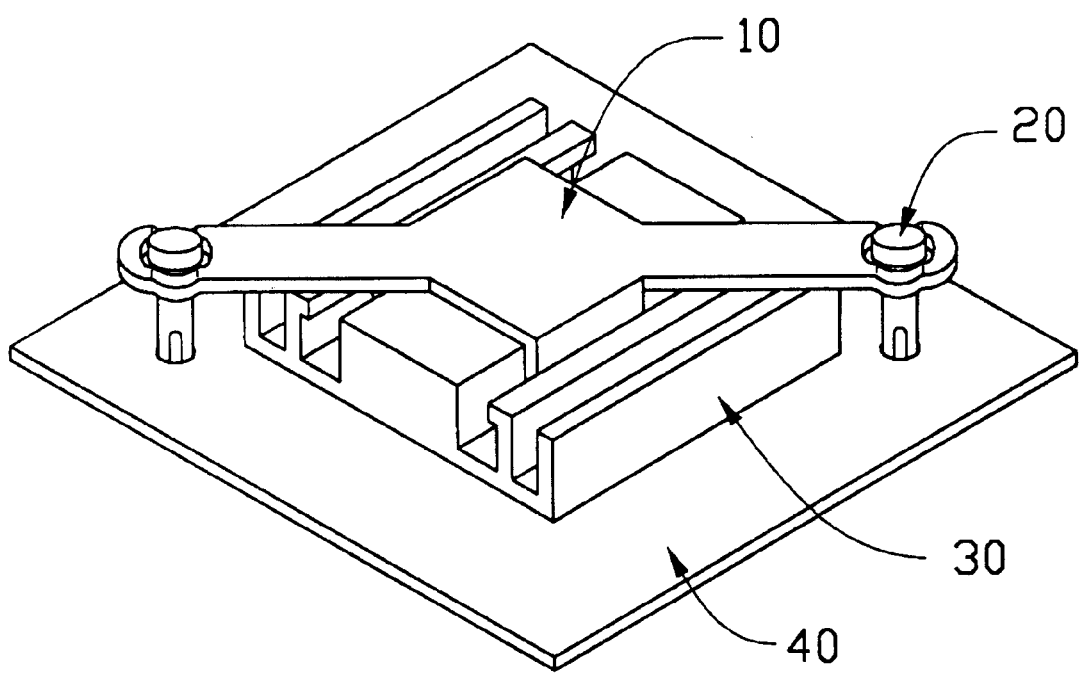
FIG. 3 is an assembled view of FIG. 2.

Referring to FIGS. 2 and 3, a clip assembly in accordance with a first embodiment of the present invention is shown. The clip assembly is adapted for retaining a heat sink 30 in contact with a heat generating chip 50 mounted on a printed circuit board 40. The clip assembly consists of a body 10 and a pair of separate fasteners 20. The body 10 and the fasteners 20 may be made from different materials as desired.

The body 10 comprises a base 101, a pair of arms 102 extending from opposite diagonal corners of the base 101 and opposite end portions 104. A pair of blades 103 downwardly extends from opposite edges of the base 101. Each blade 103 has an outwardly extending hook 106 formed on a free end thereof. A clearance hole 105 having a substantially elliptical shape is defined in each end portion 104, the function of which will be described hereinafter. A pair of arcuate surfaces 107 is formed proximate opposite transverse sides of each clearance hole 105.

Each fastener 20 comprises an intermediate main portion 21, and a head 22 and an engaging portion 23 formed on opposite ends of the main portion 21. The engaging portion 23 is conical with a diameter proximate the main portion 21 larger than that of the main portion 21. A slot 24 is defined in the engaging portion 23 and into a section of the main portion 21 for providing the fastener 20 with resiliency. The head 22 is cylindrical and has a diameter larger than that of the main portion 21. A transition section 25 is formed on a bottom portion of the head 22 tapering toward the main portion 21.

The heat sink 30 comprises a rectangular central portion 31 and a plurality of upstanding parallel fins 32 formed on opposite sides of the central portion 31. Each of the two fins 32 adjacent to the central portion 31 has a free end extending toward the central portion 31 to define a recess 33 therein for receiving the hook 106 of the body 10.

In assembly, the hooks 106 of the body 10 are press-fit into the recesses 33 of the heat sink 30 whereby a bottom surface of the base 101 of the body 10 abuts against a top surface of the central portion 31 of the heat sink 30. Thus, the body 10 is attached to the heat sink 30. The heat sink 30 with the body 10 attached thereto is then lowered onto the chip 50 which is mounted on a circuit board 40. Each fastener 20 extends through the corresponding clearance hole 105 of the body 10 and aligns with a corresponding engaging hole 41 of the circuit board 40. A force is exerted on the head 22 of each fastener 20 to engage the engaging portion 23 with the corresponding engaging hole 41. The engaging portion 23 resiliently deforms when being pressed into the engaging hole 41 and then resiles to firmly engage the engaging hole 41 thereby retaining the heat sink 30 on the chip 50.

While pressing the fastener 20, alignment between the fastener 20 and the corresponding engaging hole 41 is facilitated due to the provision of the elliptical clearance hole 105 in the body 10. The clearance hole 105 allows the fastener 20 to move therein and compensates for a tolerance of the engaging hole 41. Due to the provision of the transition section 25 of the fastener 20 and the arcuate surfaces 107 of the end portion 104 of the body 10, a reliable contact between the fastener 20 and the body 10 is achieved thereby ensuring vertical linear movement of the fastener 20 during engagement with the corresponding engaging hole 41. Thus, damage to the engaging portion 23 of the fastener 20 resulting from excessive interferential force during engagement with the corresponding engaging hole 41 is obviated.

Figure 4:
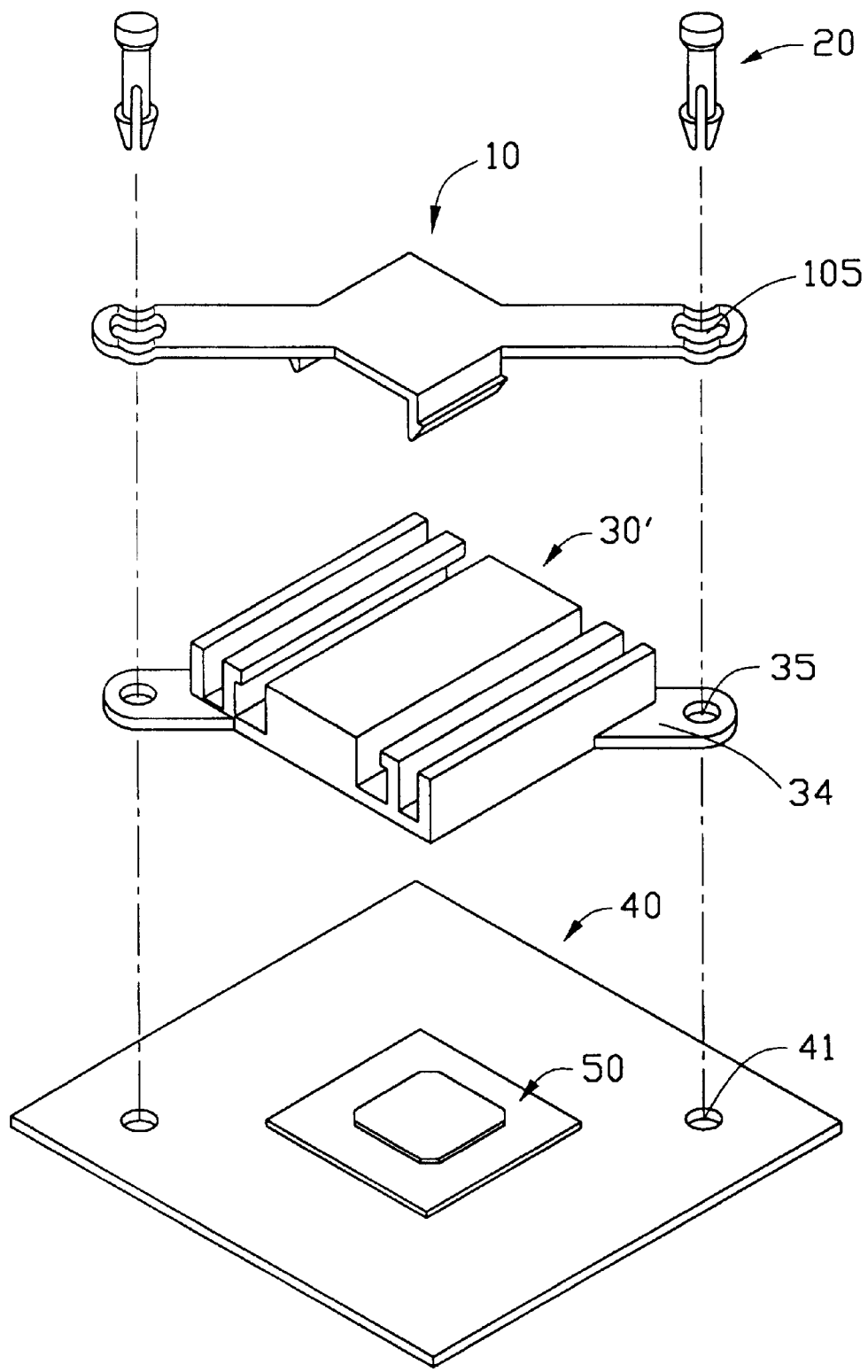
FIG. 4 is an exploded view of the clip assembly of FIG. 2, a second heat sink and the chip mounted on the printed circuit board.

Referring to FIG. 4, a second heat sink 30' having a pair of diagonal ears 34 each defining an aperture 35 therein is shown. In assembly, each fastener 20 sequentially extends through the clearance hole 105 of the body 10, the aperture 35 of the heat sink 30' and the engaging hole 41 of the circuit board 40 thereby securely attaching the heat sink 30' to the chip 50. The apertures 35 of the heat sink 30 further ensure vertical linear movement of the fasteners 20 during engagement with the corresponding engaging holes 41 thereby facilitating alignment therebetween.

Figure 5:
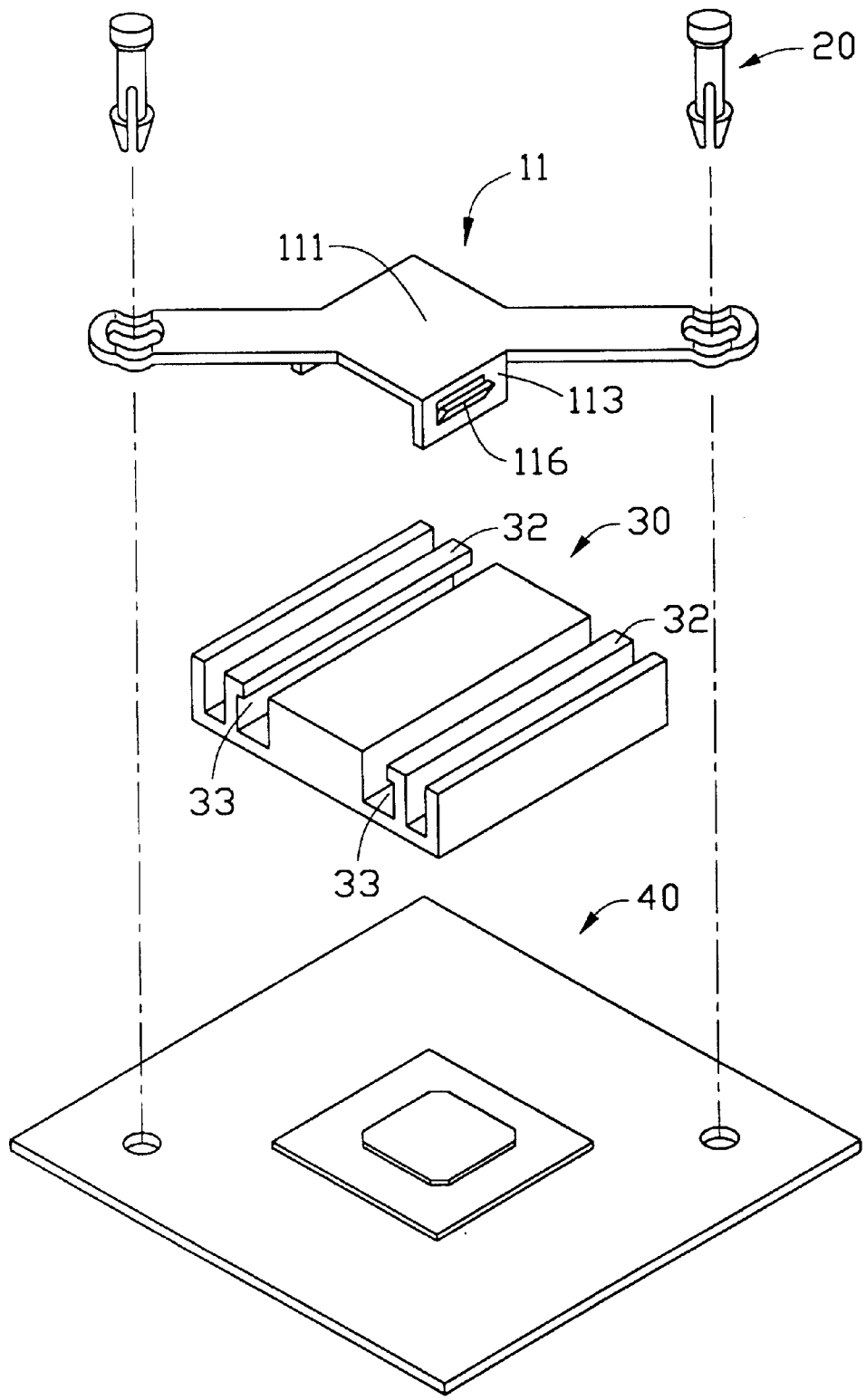
FIG. 5 is an exploded view of a clip assembly in accordance with a second embodiment of the present invention, the first heat sink and the chip mounted on the printed circuit board.

A clip assembly in accordance with a second embodiment of the present invention is shown in FIG. 5. The clip assembly comprises a body 11 made from metal and a pair of fasteners 20 identical to the first embodiment. A pair of tabs 116 is outwardly and upwardly stamped from opposite blades 113 of a base 111 for latching the corresponding recesses 33 defined in the fins 32 of the heat sink 30.

Figure 6:
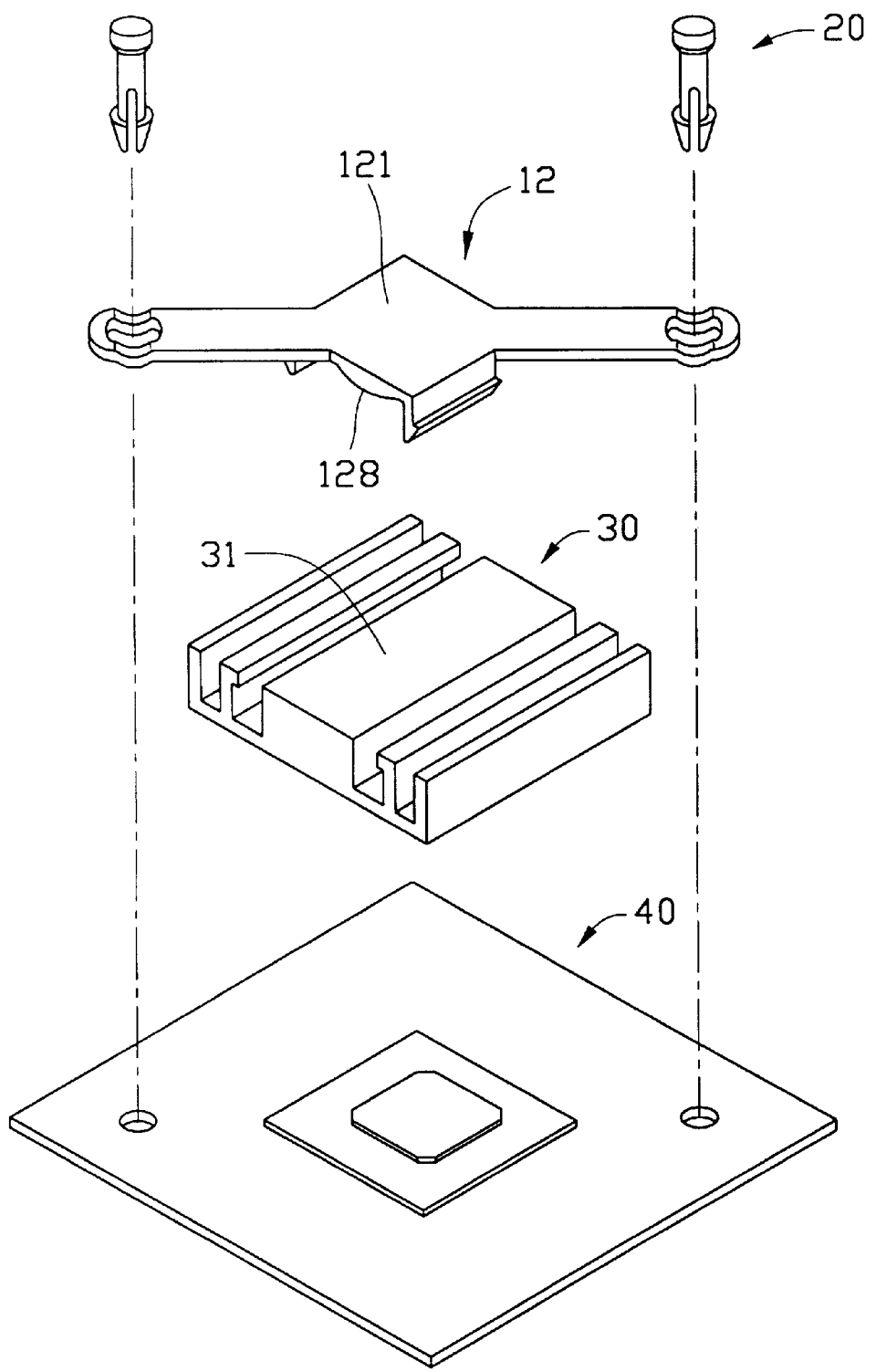
FIG. 6 is an exploded view of a clip assembly in accordance with a third embodiment of the present invention, the first heat sink and the chip mounted on the printed circuit board.
Figure 7:
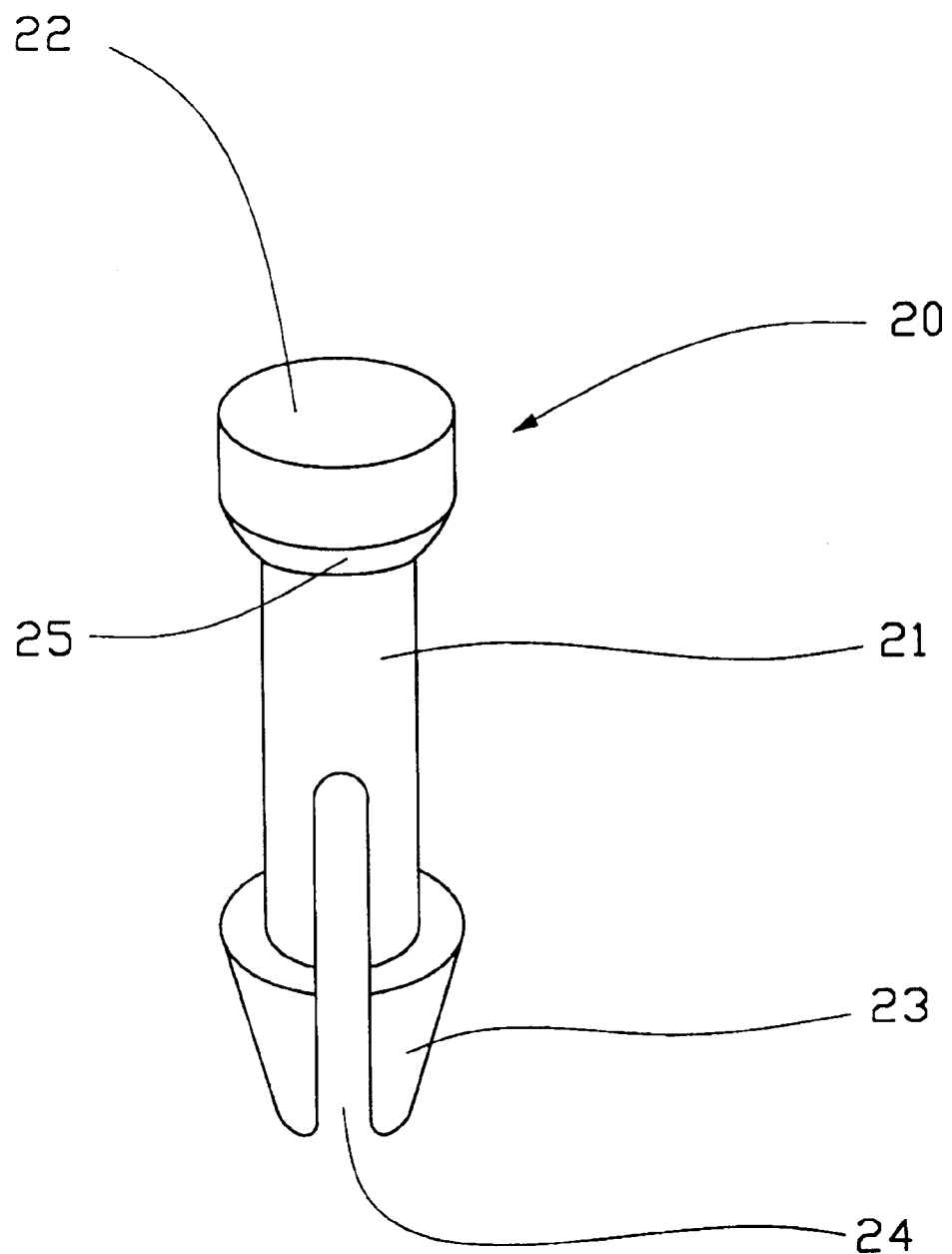
FIG. 7 is an enlarged view of a fastener of the present invention.

FIG. 6 shows a clip assembly in accordance with a third embodiment of the present invention. The clip assembly comprises a dielectric body 12 and a pair of fasteners 20 identical to the fasteners 20 of the first embodiment. A curved surface 128 is formed on a bottom surface of a base 121 of the body 12 for ensuring reliable contact with the top surface of the central portion 31 of the heat sink 30.

Due to the clearance holes 105, the arcuate surfaces 107 of each body 10, 11, 12 and the transition section 25 of the fastener 20, alignment between the fastener 20 and the corresponding engaging hole 41 is easily achieved thereby facilitating assembly.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. A clip assembly for retaining a heat sink on a board-mounted chip, comprising:

a body comprising a base, a pair of opposite arms extending from the base for abutting against a top surface of the heat sink, and a pair of holes each formed in a free end portion of each arm; and a pair of fasteners each extending into a corresponding hole formed in a corresponding arm of the body in a vertical direction and being slidably movable in the corresponding arm hole in a horizontal direction to ensure an accurate alignment with a corresponding engaging hole of a circuit board.

2. The clip assembly as described in claim 1, wherein the hole formed in each arm is substantially elliptical in shape.

3. The clip assembly as described in claim 1, wherein each fastener includes a head for engaging with the end portion of the arm, an engaging portion opposite the head for engaging with the circuit board, and a main portion formed between the head and the engaging portion.

4. The clip assembly as described in claim 3, wherein the head of each fastener is substantially cylindrical and has a diameter larger than that of the main portion, the head comprising an arcuate transition section being tapered toward the main portion for engaging with the end portion of the arm.

5. The clip assembly as described in claim 4, wherein each end portion of the arm has a pair of arcuate surfaces formed proximate opposite transverse sides of the hole for accommodating the transition section of the fastener.

6. The clip assembly as described in claim 3, wherein the engaging portion of the fastener is substantially conical and defines a slot therein which extends into a section of the main portion for providing resiliency, the engaging portion proximate the main portion having a diameter larger than that of the main portion.

7. The clip assembly as described in claim 1, wherein the base of the body has a pair of blades downwardly extending from opposite edges thereof, each blade having an outwardly extending hook formed on a free end thereof for engaging with the heat sink.

8. The clip assembly as described in claim 1, wherein the base of the body has a pair of blades downwardly extending from opposite edges thereof, each blade having a tab outwardly and upwardly stamped therefrom for engaging with the heat sink.

9. The clip assembly as described in claim 1, wherein the base of the body has a curved surface formed on a bottom surface thereof for ensuring reliable contact with the top surface of the heat sink.

10. The clip assembly as described in claim 1, wherein the body is made from plastic.

11. The clip assembly as described in claim 1, wherein the body is made from metal.

12. An electrical assembly comprising:

a clip assembly including a body and a pair of fasteners, said body comprising a base and a pair of opposite arms extending therefrom, an arm hole formed in a free end of each of said arms, each of said fasteners defining a head on a top portion thereof and an engaging portion on a bottom portion thereof;

a heat sink positioned under the clip assembly and providing a central portion in alignment with the base of the clip assembly; and a circuit board with a chip thereon under the heat sink, a pair of engaging holes defined therein;

wherein each of the fasteners extends through both the aligned corresponding arm hole and engaging hole under the condition that the head abuts against the arm of the clip assembly and the engaging portion abuts against an underside of the circuit board;

wherein each of said arm holes extends along a longitudinal direction of the corresponding arm for providing clearance thereof so as to allow the fastener to slidably move therein for assuring said fastener maintains an upright position even in a condition that the arm is deflected during assembly of the clip assembly to the circuit board.

13. A heat sink assembly comprising:

a heat sink including a central portion with a plurality of fins on two sides thereof; and a clip assembly including a body, a pair of arms extending therefrom with fasteners to secure the heat sink unto a circuit board thereunder, at least one a blade downward extending from the body with a hook thereof; wherein one of said fins defines a recess therein for receivably latchable engagement with the corresponding hook of the blade.

* * * * *